United States Patent [19]
Nakashiba

[11] Patent Number: 5,990,953
[45] Date of Patent: Nov. 23, 1999

[54] SOLID STATE IMAGING DEVICE HAVING OVERFLOW DRAIN REGION PROVIDED IN PARALLEL TO CCD SHIFT REGISTER

[75] Inventor: Yasutaka Nakashiba, Tokyo, Japan

[73] Assignee: NEC Corporation, Tokyo, Japan

[21] Appl. No.: 08/768,044

[22] Filed: Dec. 13, 1996

[30] Foreign Application Priority Data

Dec. 15, 1995 [JP] Japan .................................... 7-327542

[51] Int. Cl.$^6$ .................................................. H04N 5/335
[52] U.S. Cl. ........................ 348/314; 348/241; 257/223; 257/230
[58] Field of Search ..................... 348/241, 243, 348/248, 249, 250, 294, 311, 314, 316; 257/223, 230, 232, 221, 233; H04N 5/335

[56] References Cited

U.S. PATENT DOCUMENTS

| | | | |
|---|---|---|---|
| 4,460,912 | 7/1984 | Takeshita et al. | 257/223 |
| 5,770,870 | 6/1998 | Nakashiba | 257/230 |
| 5,796,432 | 8/1998 | Iesaka et al. | 348/314 |

FOREIGN PATENT DOCUMENTS

| | | |
|---|---|---|
| 58-31671 | 2/1983 | Japan . |
| 58-31672 | 2/1983 | Japan . |
| 62-154881 | 7/1987 | Japan . |
| 2-33275 | 2/1990 | Japan . |
| 2-205359 | 8/1990 | Japan . |

OTHER PUBLICATIONS

The Institute of Television Engineers of Japan, vol. 37, No. 10, 1983, pp. 782–787.

*Primary Examiner*—Tuan V. Ho
*Attorney, Agent, or Firm*—Young & Thompson

[57] ABSTRACT

A solid state imaging device of the present invention includes a photoelectric convert part, a vertical charge transfer part, a horizontal charge transfer part, an unnecessary charge expelling region. A channel region of the horizontal charge transfer part and the unnecessary charge expelling region have an identical impurity profile. The channel region of the horizontal charge transfer part is applied to a first voltage to be depleted and the unnecessary charge expelling region is applied to a second voltage to be in non-depleted state.

6 Claims, 15 Drawing Sheets

SOLID STATE IMAGING DEVICE HAVING OVERFLOW DRAIN REGION PROVIDED IN PARALLEL TO CCD SHIFT REGISTER

BACKGROUND OF THE INVENTION

1. Field of the Invention

The present invention relates to a solid stage imaging device and, more particularly, to a solid state imaging device having a charge expelling part region or an overflow drain region formed adjacently to a horizontal charge transfer part.

2. Description of the Related Art

A solid state imaging device has conventionally been used as a camera-integrated video tape recorder (VTR). As the number of pixels is increased in these years, the solid state imaging device has begun to be used as an input device to an electronic still camera for, in place of film exposure, converting optical information to electric signal and storing the signal in a memory medium to produce hard copy output or to observe it on the screen of a monitor.

In such a solid state imaging device, there exists unnecessary signal charge in a photoelectric converter part or in vertical and horizontal charge transfer parts. When the solid state imaging device is used as an input device to the camera-integrated VTR, since such unnecessary signal charge settles down, after display for a time corresponding to several display screens, to an insignificant level, the unnecessary charge does not present a big problem. When the solid state imaging device is used as an input device to an electronic still camera, however, there exists a time lag after a shutter button is triggered until the shutter is actually opened or closed, thus unfavorably losing the optimum shutter pushing timing.

For this reason, in the case of the solid state imaging device used as the input device to the electronic still camera; unlike it is used to the camera-integrated VTR, it becomes necessary to remove all the unnecessary signal charge present in the photoelectric converter part, vertical and horizontal charge transfer parts simultaneously with the triggering of the shutter button.

One of conventional means for removing such unnecessary charge present in the photoelectric converter part is to use blooming control in which a P$^-$ type semiconductor region having a low concentration is formed directly under an N type semiconductor region forming the photoelectric converter part so that a reverse bias is applied to the N type semiconductor substrate to expel excessive charge to the N type semiconductor substrate; while a vertical overflow drain structure is formed so that the N type semiconductor region per se is depleted to expel all signal charge to the N type semiconductor substrate (refer to a journal of The Institute of Television Engineers of Japan, Vol. 37, No. 10, 1983, pp. 782–787).

Further, with respect to the unnecessary charge present in the horizontal charge transfer part, since the horizontal transfer part can operate at a higher speed, the usual operation enables the unnecessary charge is expelled to a reset drain provided at an end of the horizontal charge transfer part.

Meanwhile, removal of unnecessary charge present in the vertical charge transfer part requires a charge transfer time corresponding to at least one or several display screens.

As a method for removing the unnecessary charge of the vertical charge transfer part, there has been proposed a first method in which a drain for removal of the unnecessary charge is provided at an end of a vertical charge transfer part on the opposite side of a horizontal charge transfer part, a still camera is put in its usable state even when the camera is not in use to previously set an embedded channel of the vertical charge transfer part and a substrate in their reverse biased state to thereby remove the unnecessary charge (Japanese Patent Laid-Open Publication No. 58-31671); a second method in which a drain for removal of unnecessary charge is provided at an end of a vertical charge transfer part CCD opposed to a horizontal charge transfer part to reversely transfer, i.e., remove unnecessary charge on the vertical charge transfer part CCD (Japanese Patent Laid-Open Publication No. 58-31672); or a third method in which a drain is provided in a connection part between horizontal and vertical charge transfer parts and a reset gate is controlled to remove unnecessary charge (Japanese Patent Laid-Open Publication No. 58-31672).

However, these methods have had their defects. That is, the first method has been defective in that, since the vertical charge transfer part is always put in its depleted state, a time taken for removing the unnecessary charge on the vertical charge transfer part becomes very long and a reverse biasing power source must be always applied. The second method has had a disadvantage that the removal of the unnecessary charge is carried out by reversely transferring the unnecessary charge, which undesirably results in that,since the direction of the reverse transfer is different from that of the normal signal charge, this causes local signal loss, leading to a failure thereof (refer to Japanese Laid-Open Publication No. 2-33275). This disadvantage can be undesirably removed only by a complex method for driving the solid state imaging device. Further, the third method requires narrow and fine formation of a control gate and unnecessary charge expelling drain, which makes it difficult to manufacture it. The third method also requires the control gate to be applied with a pulse for controlling it, which leads to the fact that its resultant solid state imaging device must be driven in a complex manner.

To avoid such defects, there has recently been proposed a method in which an unnecessary charge expelling region is formed adjacent to a horizontal charge transfer part so that unnecessary charge of a vertical charge transfer part is removed by forwardly transferring it (refer to Japanese Laid-Open Publication No. 2-205359, No. 62-154881).

FIG. 14 schematically shows an arrangement of a prior art solid state imaging device having an charge expelling part adjacent to a horizontal charge transfer part. The prior art solid state imaging device includes a photoelectric converter part 1101, a vertical charge transfer 1102, a horizontal charge transfer 1103, an output circuit part 1104, an unnecessary charge expelling part 1105, and an N$^{++}$ type region 1106 connected to a power supply voltage provided at one end of the unnecessary charge expelling part 1105.

FIG. 15 is a plan view of a region having the unnecessary charge expelling part 1105 adjacent to the horizontal charge transfer 1103 in the prior art, which includes, a vertical charge transfer channel 1201, a horizontal charge transfer channel 1202, a potential barrier region 1203, an unnecessary charge expelling region 1204, a first horizontal charge transfer electrode 1205, a second horizontal charge transfer electrode 1206, and a final vertical charge transfer electrode 1207.

FIG. 16 shows a cross-sectional view of the prior art solid state imaging device of FIGS. 14 and 15 taken along a plane I–I' and a diagram showing its potential. The illustrated cross-sectional view includes an N$^{--}$ type semiconductor substrate 1301 having an impurity concentration of about $2.0 \times 10^{14} \text{cm}^{-3}$, a P type well layer 1302 having an impurity concentration of about $1.0 \times 10^{16} \text{cm}^{-3}$, an N type semiconductor region 1303 having an impurity concentration of about $1.0 \times 10^{17} \text{cm}^{-3}$ and having an embedded or buried channel of vertical and horizontal charge transfer parts and a potential barrier part formed therein, an N⁺ type semiconductor region 1305 having an impurity concentration of about $1.0 \times 10^{18} \text{cm}^{-3}$ formed as the unnecessary charge expelling part, a P⁺ type semiconductor region 1307 having an impurity concentration of about $1.0 \times 10^{18} \text{cm}^{-3}$ formed as an element separator, a first horizontal charge transfer electrode 1205 made of a first polycrystalline silicon layer 1308, and a final vertical charge transfer electrode 1207 made of a second polycrystalline silicon layer 1309. N type semiconductor region 1303 directly under the vertical charge transfer part, a vertical/horizontal connector part, the potential barrier part is formed to have a width which is narrower than the N type semiconductor region 1303 directly under the horizontal charge transfer part to secure a narrow effect. Applied to the N⁺ type semiconductor region 1305 formed as the unnecessary charge expelling part is a power supply voltage $V_D$ of usually about 15V through the N⁺⁺ type semiconductor regions 1106 and 1306 provided at one end of the unnecessary charge expelling part and having an impurity concentration of about $1.0 \times 10^{20} \text{cm}^{-3}$ thereby to be in non depleted state. That is, A whole of the N⁺ type semiconductor region 1305 exists holes provided from the N⁺⁺ type semiconductor region 1306. As soon as the unnecessary charge are injected to the unnecessary charge expelling part, the unnecessary charge becomes extinct to recombine with the holes. The horizontal charge transfer part is in depleted stage by its impurity concentration and provided the power supply power. A potential $\psi B$ at potential barrier part is set up deeper than a potential $\Psi VH$ at vertical/horizontal connector part so as not to flow backward from the unnecessary charge expelling part to the horizontal charge transfer part.

FIG. 17 shows a cross-sectional view of the prior art solid state imaging device taken along a plane II–II' and also a diagram showing its potential. The illustrated cross-sectional view includes the N⁻⁻ type semiconductor substrate 1301, the P type well layer 1302, the N type semiconductor region 1303, an N⁺⁺ type semiconductor substrate 1304 having an impurity concentration of about $7.0 \times 10^{16} \text{cm}^{-3}$, an N⁺⁺ type semiconductor region 1306,1311 having a floating diffusion layer and a reset drain part formed therein, the P⁺ type semiconductor region 1307 formed as an element separator, the first horizontal charge transfer electrode 1205 made of the first polycrystalline silicon layer 1308, and the second horizontal charge transfer electrode 1206 made of the second polycrystalline silicon layer 1309. Applied to the N⁺⁺ type semiconductor region forming the reset drain of signal charge is a power supply voltage $V_D$ of usually about 15V.

FIG. 18 shows a cross-sectional view of the prior art solid state imaging device of FIG. 14 taken along a plane III—III' and a diagram showing its potential. The illustrated cross-sectional view includes the N⁻⁻ type semiconductor substrate 1301, the P type well layer 1302, the N⁺ type semiconductor region 1305 forming the unnecessary charge expelling part, the P⁺ type semiconductor region 1307 formed as the element separator, the first horizontal charge transfer electrode 1205 made of the first polycrystalline silicon layer 1308, and the second horizontal charge transfer electrode 1206 made of the second polycrystalline silicon layer 1309. Applied to the N⁺ type semiconductor region 1305 is the power supply voltage $V_D$ of usually about 15V through the N⁺⁺ type semiconductor region 1306 provided at one end of the unnecessary charge expelling part. The power supply voltage VD applied to N⁺⁺ type semiconductor region 1306 shown in FIG.18 is the same voltage source at the power supply voltage VD applied to N⁺⁺ type semiconductor region 1306 shown in FIG.17.

Explanation will be made as to the operation of the prior art solid state imaging device having such an arrangement as mentioned above with referring to FIG. 19.

During unnecessary charge expelling duration, as mentioned above, the removal of the unnecessary charge present in the photoelectric converter part 1101 is achieved in such a manner that the P⁻ type semiconductor region having a low impurity concentration is formed directly below the N type semiconductor region forming the photoelectric converter part and the reverse bias is applied to the N⁻⁻ type semiconductor substrate 1301 to deplete the N type semiconductor region itself to thereby expel all signal charge to the N⁻⁻ type semiconductor substrate 1301.

Together with the aforementioned operation, the unnecessary charge present in the photoelectric converter part 1101 is transferred all together toward the horizontal charge transfer 1103, e.g., by a 4-phase clock pulse. At this time, applied to the first and second horizontal charge transfer electrodes 1205 and 1206 are a high level voltage $V_H$ at a terminal $\phi H_1$ and a low level voltage $V_L$ at a terminal $\phi H_2$ as shown in FIG. 16, so that excessive charge, which has been not accumulated in the horizontal charge transfer 1103, is removed or absorbed into the N⁺ type semiconductor region 1305 of the unnecessary charge expelling part 1105 provided adjacent to the potential barrier exceeding a potential $\Phi B$ of the barrier formed deeper than a potential $\Phi VH$ on a vertical/horizontal connector in such a manner that the excessive charge is prevented from going back to the vertical charge transfer 1102.

With respect to unnecessary charge remained at the horizontal charge transfer 1103, such a 2-phase clock pulse as shown in FIG. 13 causes normal high-speed operation of the horizontal charge transfer part, whereby the remaining charge is removed or absorbed into the N⁺⁺ type semiconductor region 1306 of the reset drain provided at one end of the horizontal charge transfer 1103.

Subsequently, the signal charge accumulated in the photoelectric converter part 1101 by the quantity of incident light for a predetermined time is read and sent to the corresponding vertical charge transfer 1102, sent to the horizontal charge transfer 1103 for every horizontal line vertically transferred through the respective vertical charge transfers 1102, horizontally transferred through the horizontal charge transfer 1103, and then output through the output circuit part 1104.

As mentioned above, even if charge signal exceeding an charge transfer ability of the horizontal charge transfer part transfers from the vertical charge transfer part into the horizontal charge transfer part, oversupply charge do not flow back to the vertical charge transfer part. Accordingly, the solid stage imaging device of the prior art can prevent from being white on a monitor display.

However, with such a solid state imaging device having the unnecessary charge expelling region adjacent to the horizontal charge transfer part as mentioned above, the horizontal charge transfer channel 1202, potential barrier region 1203 and unnecessary charge expelling channel 1204 must be formed under the charge transfer electrode 1205 of the horizontal charge transfer part to remove the unnecessary charge overflowing at the horizontal charge transfer part.

For this reason, this solid state imaging device has had a defect that, the number of manufacturing steps is increased to form N type semiconductor region 1303 and N$^+$ type semiconductor region 1305 under the horizontal charge transfer electrode.

Further, since the N$^+$ type semiconductor region as the unnecessary charge expelling part having a relatively high impurity concentration is formed under the horizontal charge transfer electrode, this solid state imaging device has also had another defect that, upon forming a gate insulating film under the horizontal charge transfer electrode in a later step, outward impurity diffusion from the N$^+$ type semiconductor region causes formation of an abnormal diffusion layer in the N type semiconductor region as the channel region or the potential barrier region, thus involving variations in the potential.

SUMMARY OF THE INVENTION

Accordingly, it is an object of the present invention to provide a solid state imaging device whose manufacturing steps is fewer.

It is another object of the present invention to provide a solid state imaging device preventing from variations in the potential by the abnormal diffusion.

In accordance with an aspect of the present invention, there is provided a solid state imaging device which comprises a plurality of photoelectric converter parts two-dimensionally arranged, a plurality of vertical charge transfer parts arranged adjacent to said photoelectric converter parts, a horizontal charge transfer part arranged adjacent to one ends of said vertical charge transfer parts, an output circuit part, a channel region of the horizontal charge transfer part under a horizontal charge transfer electrode, an unnecessary charge expelling region, and a potential barrier region, wherein the channel region of the horizontal charge transfer part and the unnecessary charge expelling region have an identical concentration profile, the channel region of the horizontal charge transfer part is depleted by a potential applied to a diffusion layer provided at one end the horizontal charge transfer part, and the channel region of the unnecessary charge expelling part is put in its non-depleted state by a potential applied to the diffusion layer arranged at one or both ends thereof.

BRIEF DESCRIPTION OF THE DRAWINGS

The above and other objects, features and advantages of the present invention will become apparent from the following detailed description when taken with the accompanying drawings in which.

DESCRIPTION OF THE PREFERRED EMBODIMENTS

Figure 1:
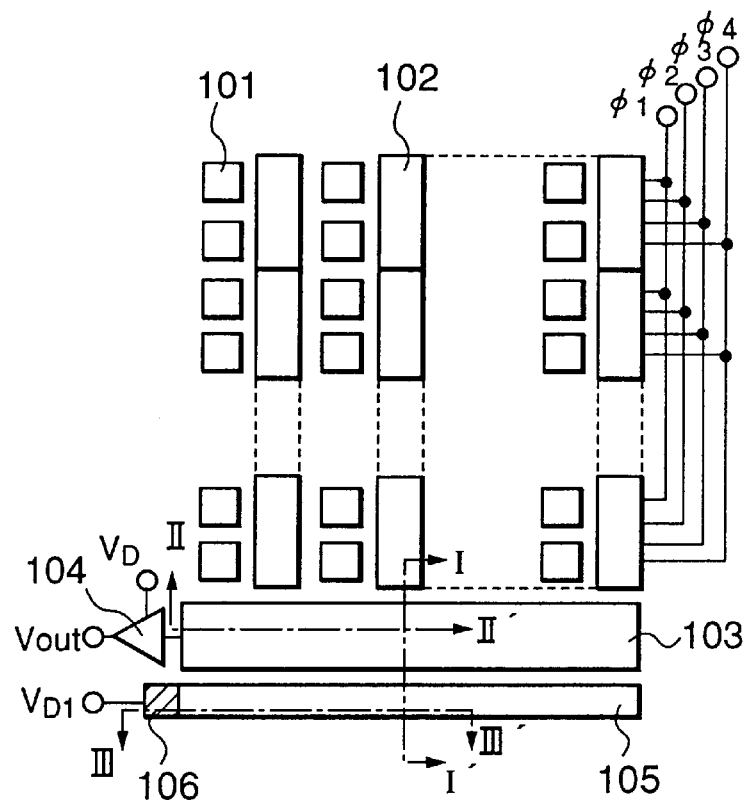
FIG. 1 schematically shows an arrangement of a solid state imaging device having a charge expelling part adjacent to a horizontal charge transfer part in accordance with a first embodiment of the present invention.

Referring to FIG. 1, A solid state imaging device in accordance with a first embodiment of the present invention includes a photoelectric convertering element or pixel 101, a vertical charge transfer section or CCD shift resister 102, a horizontal charge transfer region or CCD shift register 103, an output circuit 104, an unnecessary charge expelling portion or an overflow drain region 105, and an N$^{++}$ type region 106 provided at one end of the overflow drain region 105 and connected to a constant voltage $V_{D1}$. $\Phi$1–$\Phi$4 is driving signals to drive the vertical charge transfer parts 102.

Figure 2:
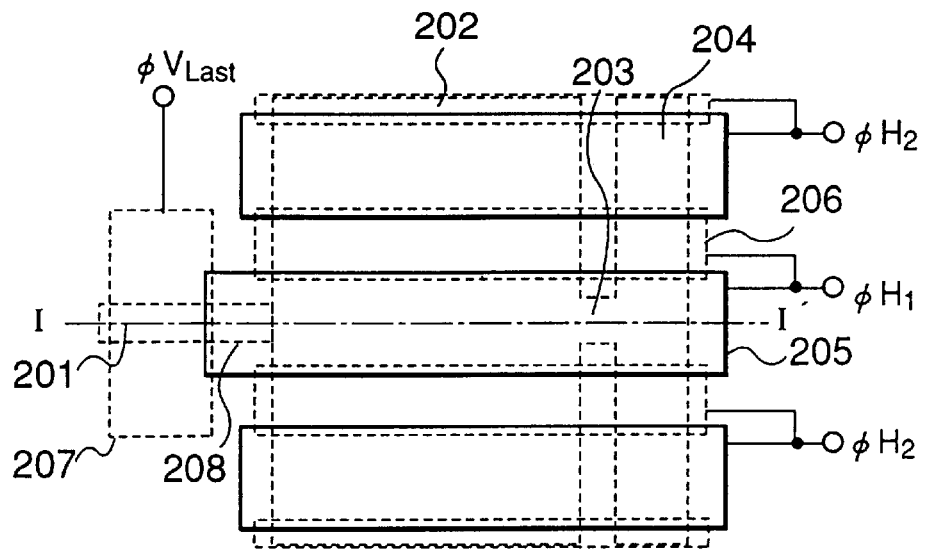
FIG. 2 is a plan view of a zone having the charge expelling part adjacent to the horizontal charge transfer part in the first embodiment of the present invention.

Referring to FIG. 2, which is an enlargement diagram along line I–I' of FIG. 1, the solid state imaging device of the present invention includes a vertical charge transfer channel 201, a horizontal charge transfer channel 202, a potential barrier region 203, an unnecessary charge expelling region or overdrawn 204, a first horizontal charge transfer electrode 205 made of a first polycrystalline silicon layer, a horizontal charge transfer electrode 206 made of a second polycrystalline silicon layer, a final vertical charge transfer electrode 207, and a vertical/horizontal connector channel 208. The vertical charge transfer channel 201, horizontal charge transfer channel 202, the potential barrier region 203, the unnecessary charge expelling region 204, and the vertical/horizontal connector channel 208 is formed to surround P+ type semiconductor region as element separate portion formed at outside of a zone enclosed by a broken line.

Figure 3:
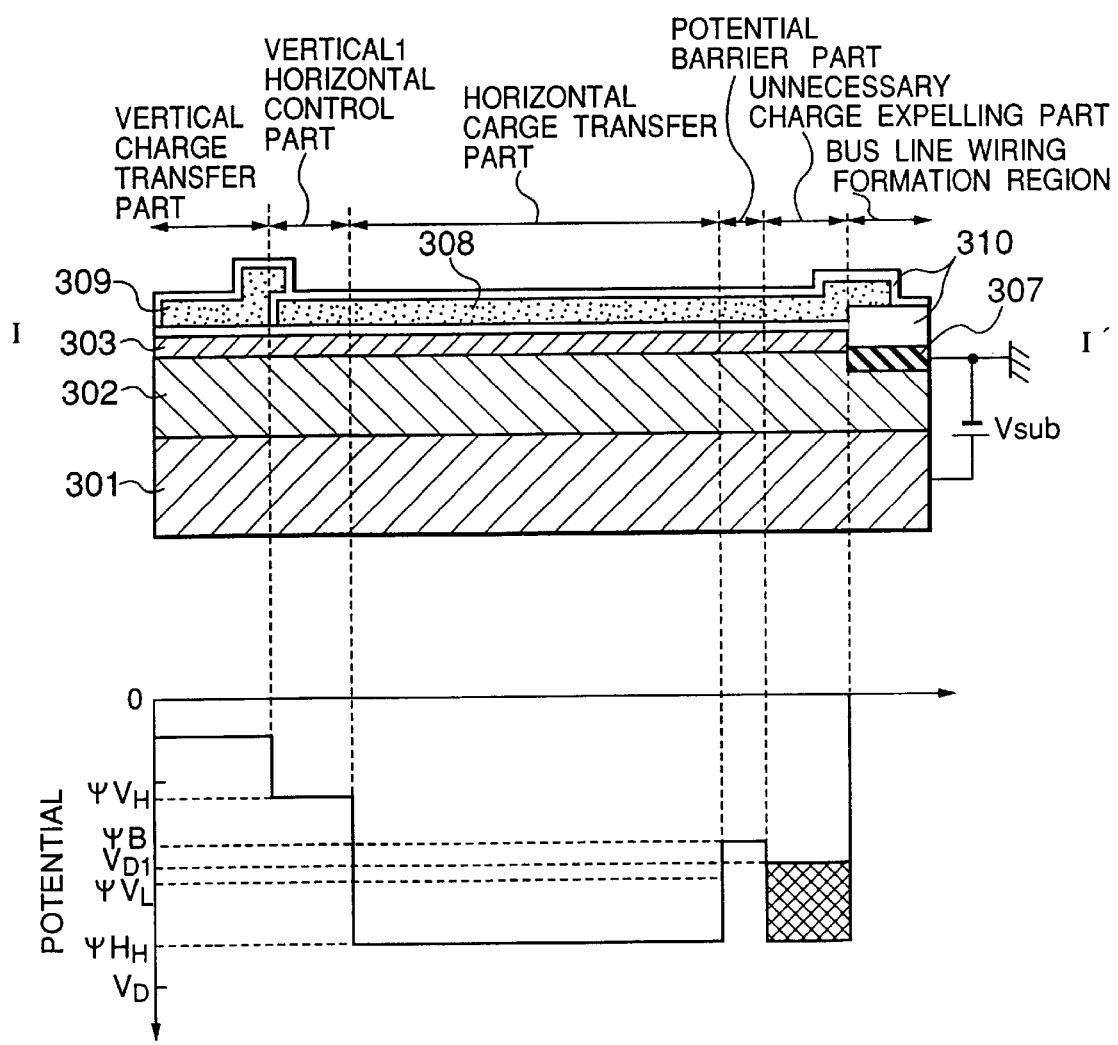
FIG. 3 shows a cross-sectional view of the solid state imaging device of the first embodiment taken along a plane I–I' and a diagram showing its potential.

Refereeing to FIG. 3, the solid state imaging device of the first embodiment of the present invention includes an $N^{--}$ type semiconductor substrate 301 having an impurity concentration of about $2.0 \times 10^{14} cm^{-3}$, a P type well layer 302 having an impurity concentration of about $1.0 \times 10^{16} cm^{-3}$, an N type semiconductor region 303 having an impurity concentration of about $1.0 \times 10^{17} cm^{-3}$ having vertical and horizontal charge transfer parts, a potential barrier region and an unnecessary charge expelling part, a $P^+$ type semiconductor region 307 having an impurity concentration of about $1.0 \times 10^{18} cm^{-3}$ forming an element separator, the first horizontal charge transfer electrode 205 made of the first polycrystalline silicon layer 308, and the final vertical charge transfer electrode 207 of the second polycrystalline silicon layer 309. The channel region of the horizontal charge transfer part and the unnecessary charge expelling part of the present invention is an identical impurity profile.

A potential $\phi B$ at the potential barrier region is formed deeper than a potential $\phi VH$ at the vertical/horizontal connector to prevent from going back to the vertical charge transfer channel 102. The potential $\psi B$ at the potential barrier region and the potential $\phi VH$ at the vertical/horizonal connector channel is set up by the narrow channel effect respectively.

Figure 4:
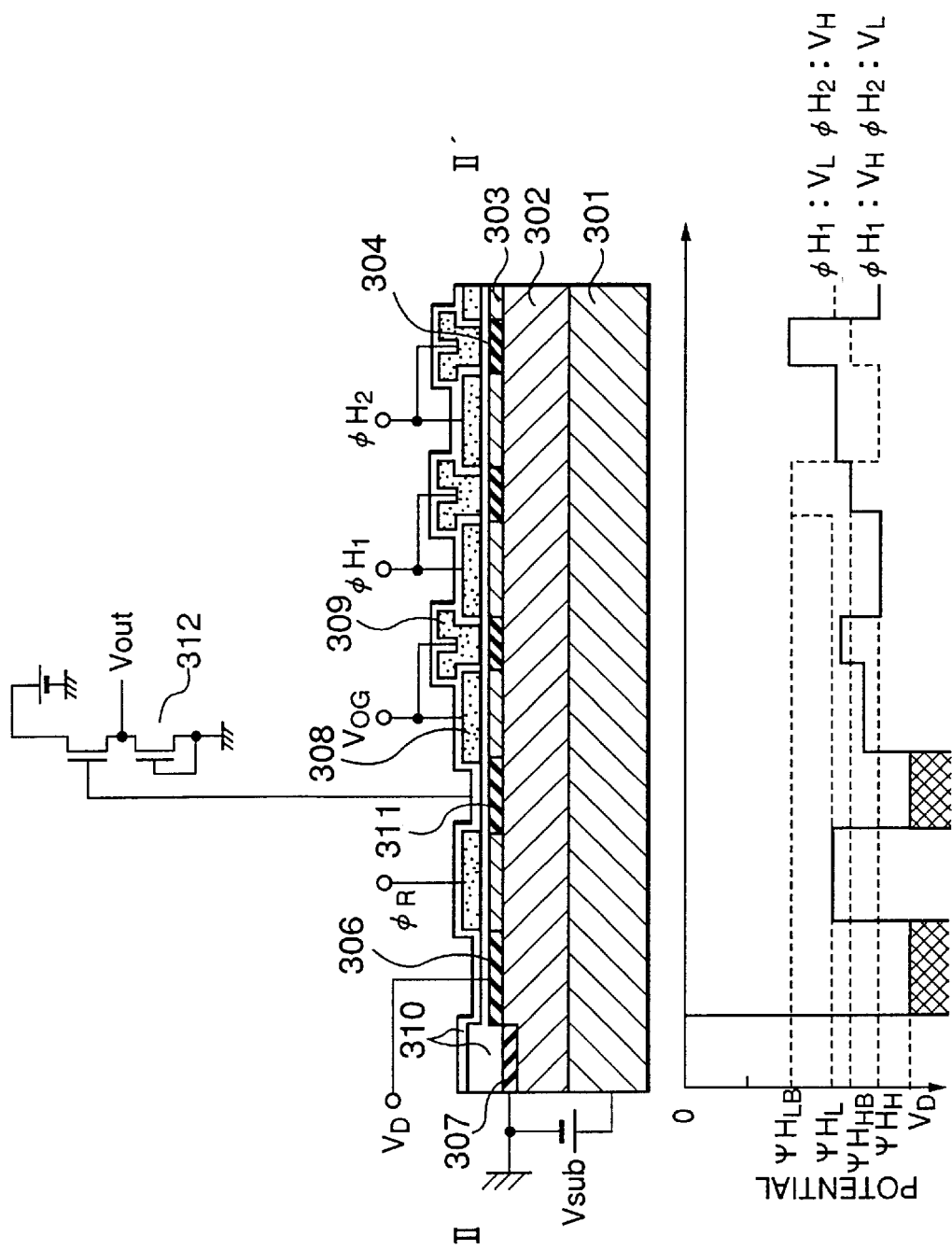
FIG. 4 shows a cross-sectional view of the solid state imaging device of the first embodiment taken along a plane II–II' and a diagram showing its potential.

Referring to FIG. 4, the solid state imaging device of the present invention includes the $N^{--}$ type semiconductor substrate 301, the P type well layer 302, the N type semiconductor region 303, an $N^-$ type semiconductor region 304 having an impurity concentration of about $7.0 \times 10^{16} cm^{-3}$, an $N^{++}$ type semiconductor region 311,306 having a floating diffusion part and a reset drain part respectively, the $P^+$ type semiconductor region 307 forming an element separator, the first horizontal charge transfer electrode 205 (refer to FIG. 2) of the first polycrystalline silicon layer 308, and the horizontal charge transfer electrode 206 (refer to FIG. 2) of the second polycrystalline silicon layer 309. In the illustrated example, applied to the $N^{++}$ type semiconductor region 306 forming the reset drain of signal charge is a power supply voltage $V_D$ of usually about 15V. Accordingly, the channel of the horizontal charge transfer part is in depleted state. The potential of the horizontal charge transfer part changes in response to supply of complementary horizontal charge transfer signals $\phi H1, H2$ to the horizontal charge transfer electrode. A constant voltage VOG is supplied to the final horizontal charge transfer electrode. A charge information stored in the floating diffusion part transfers to an output circuit 312. $\phi R$ is a reset pulse.

Figure 5:
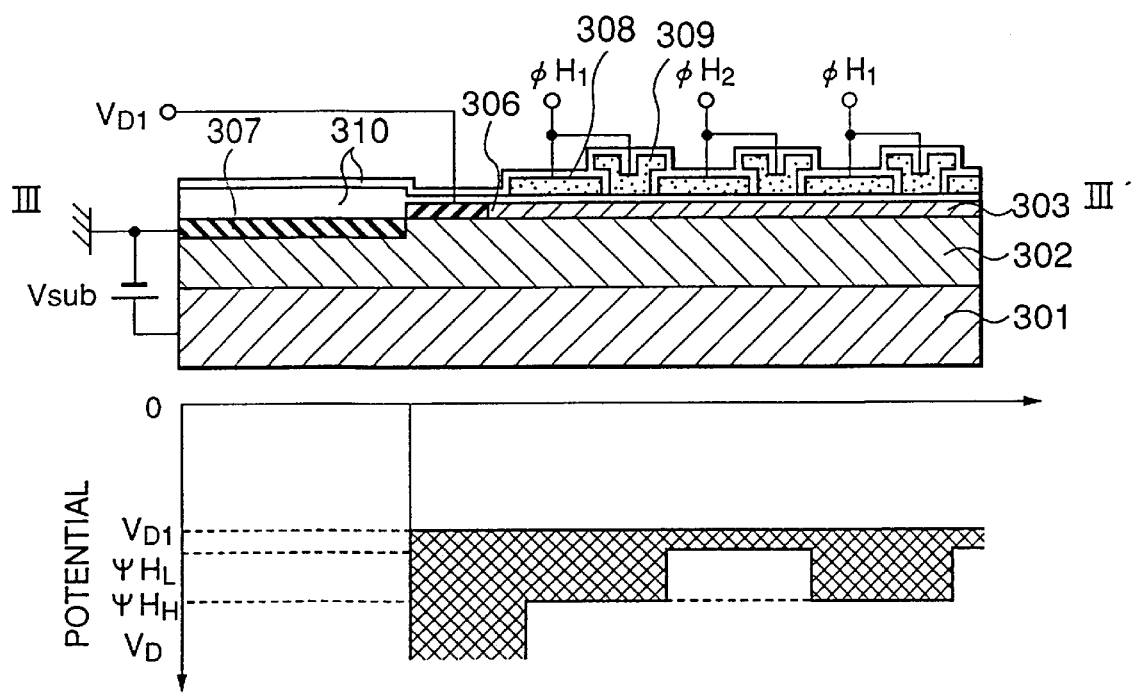
FIG. 5 shows a cross-sectional view of the solid state imaging device of the first embodiment taken along a plane III–III' and a diagram showing its potential.

Referring to FIG. 5, the solid state imaging device of the present invention includes the $N^{--}$ type semiconductor substrate 301, the P type well layer 302, the $N^{++}$ type semiconductor region 306 provided at one end of the unnecessary charge expelling part, the $P^+$ type semiconductor region 307 forming the element separator, the first horizontal charge transfer electrode 205 (refer to FIG. 2) made of the first polycrystalline silicon layer 308, and the horizontal charge transfer electrode 206 (refer to FIG. 2) made of the second polycrystalline silicon layer 309. A potential at N type semiconductor region 303 under horizontal charge transfer electrode applied to a low horizontal charge transfer signal $\phi H2$ is a potential $\psi HL$. A potential at N type semiconductor region 303 under horizontal charge transfer electrode applied to a high level horizontal charge transfer signal $\phi H$. A constant voltage $V_{D1}$ is applied to the unnecessary charge expelling part through the $N^{++}$ type regions 106 and 306 provided at one end of the unnecessary charge expelling part so as to be in non-depleted state even if the potential at N type semiconductor region 303 is the potential $\psi HL$. That is, when the first horizontal charge transfer electrode 205 is at its low level, N type semiconductor region 303 receives the constant voltage VD1 which is shallower than a potential $\Psi H_L$ induced in the N type semiconductor region 303 under the first horizontal charge transfer electrode 205 and is deeper than a potential $\phi B$ at the potential barrier part (see FIG.3). In this connection, a difference between the constant voltage $V_{D1}$ and the potential $\phi H_L$, the constant voltage VD1 and the potential $\Phi B$ is desirably 0.5 V or more. That is, it is problem that charge flow back from the unnecessary charge expelling region to the horizontal charge transfer part when the constant voltage VD1 is shallower than the potential $\psi B$. On the other hand, when the constant voltage VD1 is deeper than the potential $\psi HL$, the unnecessary charge expelling region under the horizontal charge transfer electrode applied to low level is in depleted state and therefore it is difficult for holes to supply from $N^{++}$ type semiconductor region 306 to the unnecessary charge expelling region since the unnecessary charge expelling region become high resistance. Accordingly, the problem occurs that removing the unnecessary charge in the unnecessary charge expelling region is late. Therefore, the constant voltage D1 is set up between a potential $\psi HL$ and a potential $\psi B$, moreover, is deniable to set up the extent above mentioned.

Figure 6A:
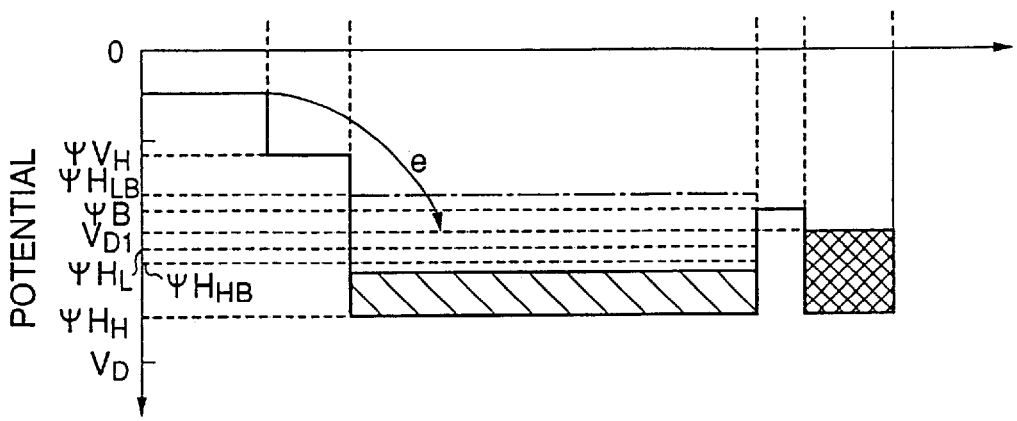
FIGS. 6a–6c show a timing chart of the diagram of potential as shown in FIG. 3.
Figure 6B:
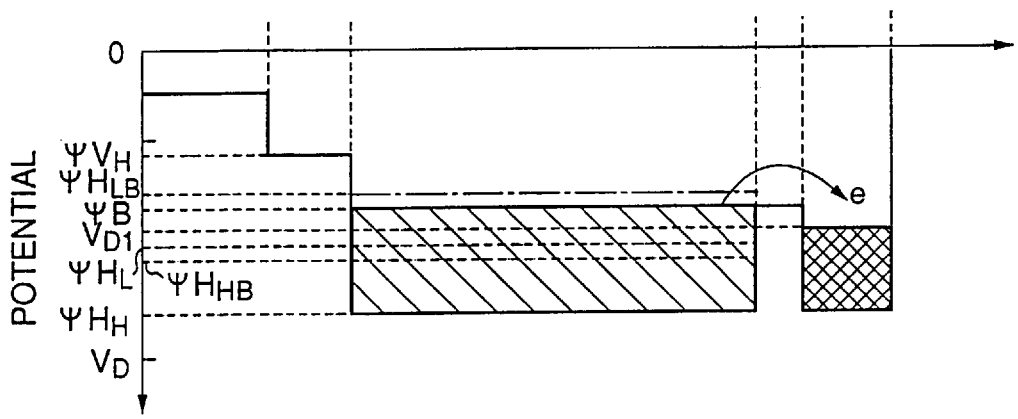
Figure 6C:
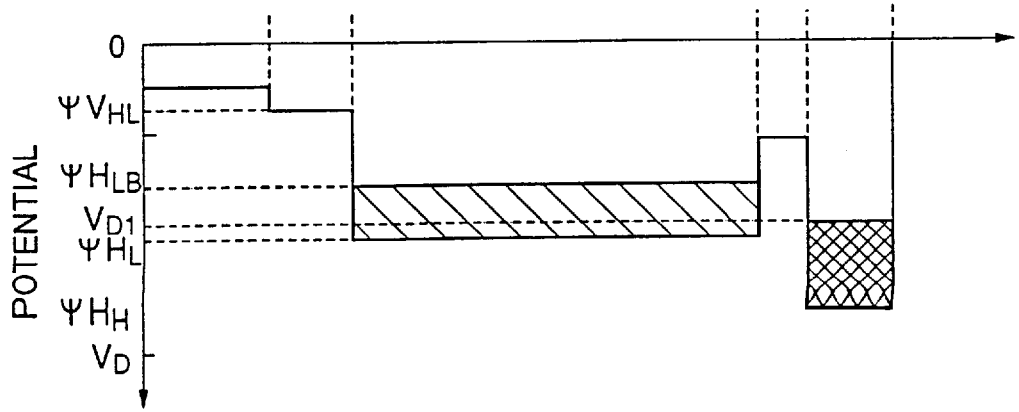
Figure 7A:
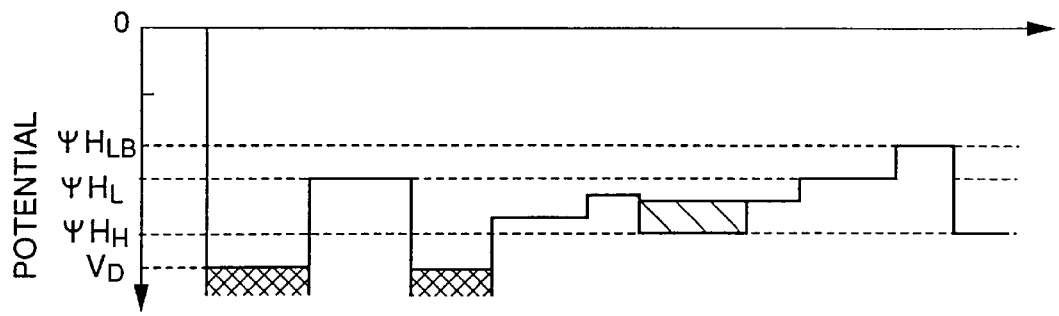
FIGS. 7a–7c show a timing chart of the diagram of potential as shown in FIG. 4.
Figure 7B:
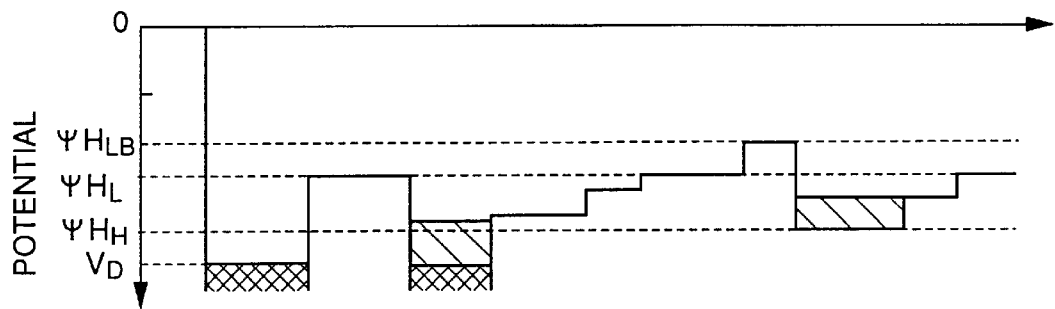
Figure 7C:
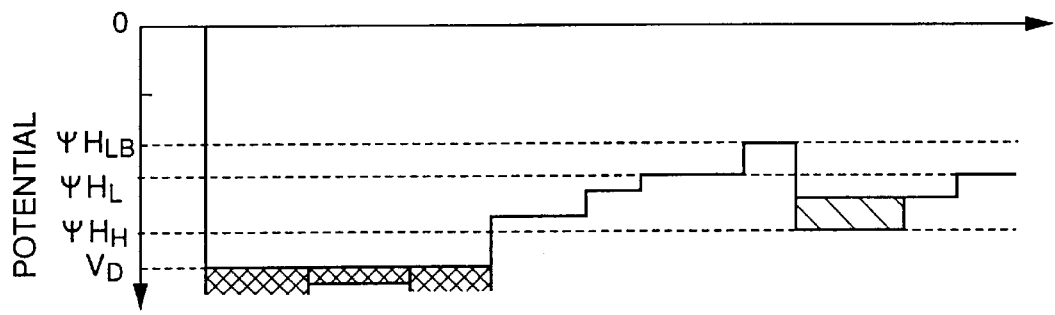
Figure 8:
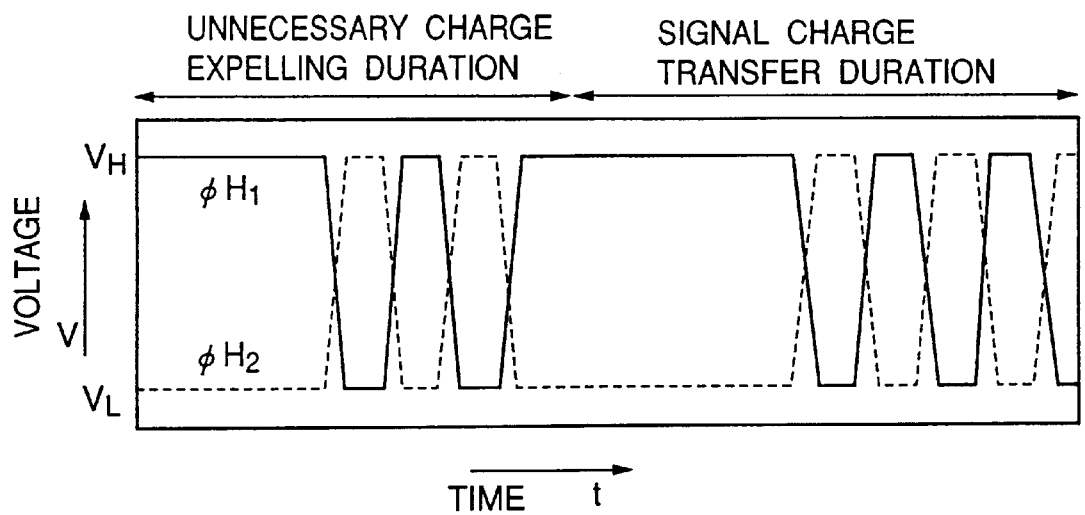
FIG. 8 shows an exemplary clock pulse applied to the horizontal charge transfer part of the solid state imaging device of the first embodiment of the present invention.

Referring to FIGS. 6–8, during unnecessary charge expelling duration, as already explained above, the removal of the unnecessary charge present in the photoelectric converter part 101 is carried out by forming the $P^-$ type semiconductor part having a low impurity concentration directly under the N type semiconductor region forming the photoelectric converter part and by applying a reverse bias to the $N^{--}$ type semiconductor substrate 301 to depleting the N type semiconductor region itself to thereby expel all the signal charge to the $N^{--}$ type semiconductor substrate 301.

Together with the aforementioned operation, the unnecessary charge present in the vertical charge transfer part 102 is all together transferred by, e.g., a 4-phase clock pulse toward the horizontal charge transfer part 103. At this time, applied to the first and second horizontal charge transfer electrodes 205 and 206 are a high level voltage $V_H$ at a terminal $\phi H_1$ and horizontal charge transfer electrodes arranged adjacent to the first and second horizontal charge transfer electrodes 205 and 206 are a low level voltage $V_L$ at a terminal $\phi H_2$. Therefore, as shown in FIG. 6a, charge accumulates the channel 202 of the horizontal charge transfer part. Then, an overflowing charge in the channel 202 of the horizontal charge transfer part is removed or absorbed into the N type semiconductor region 303 of the necessary charge expelling part over the potential barrier part as shown is FIG. 6b.

Thereafter, with respect to unnecessary charge remained on the horizontal charge transfer part 103, such a 2-phase clock pulse as shown in FIG. 8 causes normal high-speed operation of the horizontal charge transfer part, whereby the remaining charge is removed or absorbed into the $N^{++}$ type semiconductor region 306 of the reset drain provided at one end of the horizontal charge transfer 103.

Subsequently, in shifting to signal charge transfer duration, the signal charge accumulated in the photoelectric converter part 101 by the quantity of incident light for a predetermined time is read and sent to the horizontal charge transfer part 103 via the vertical charge transfer part 102. Charge signal in the horizontal charge transfer part 103 is transferred in response to the horizontal transfer signals as shown in FIG.7a and accumulates in floating charge region 311 as shown in FIG.7b. The charge signal is output through the output circuit part 104. Thereafter, a potential at the floating charge region 311 is reset by the reset pulse φR.

Figure 9:
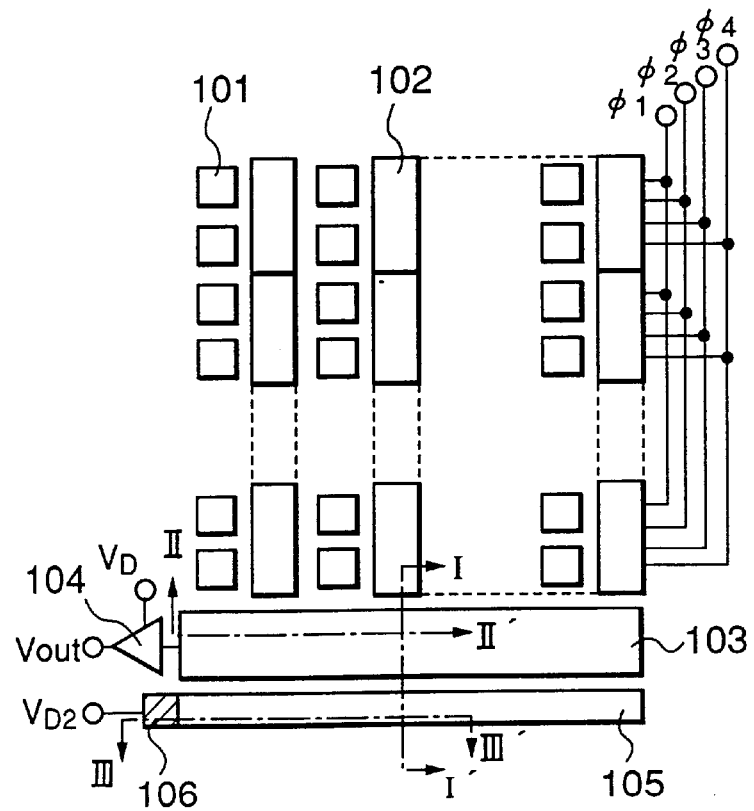
FIG. 9 schematically shows an arrangement of a solid state imaging device having a charge expelling part adjacent to a horizontal charge transfer part in accordance with a second embodiment of the present invention.

Shown in FIG. 9 is a schematic arrangement of a solid state imaging device having a charge expelling part adjacent to a horizontal charge transfer part in the second embodiment of the present invention. The present embodiment is different from the first embodiment of the present invention in that a constant voltage $V_{D2}$ is applied to the $N^{++}$ type region 106 provided at one end of the unnecessary charge expelling part.

Figure 10:
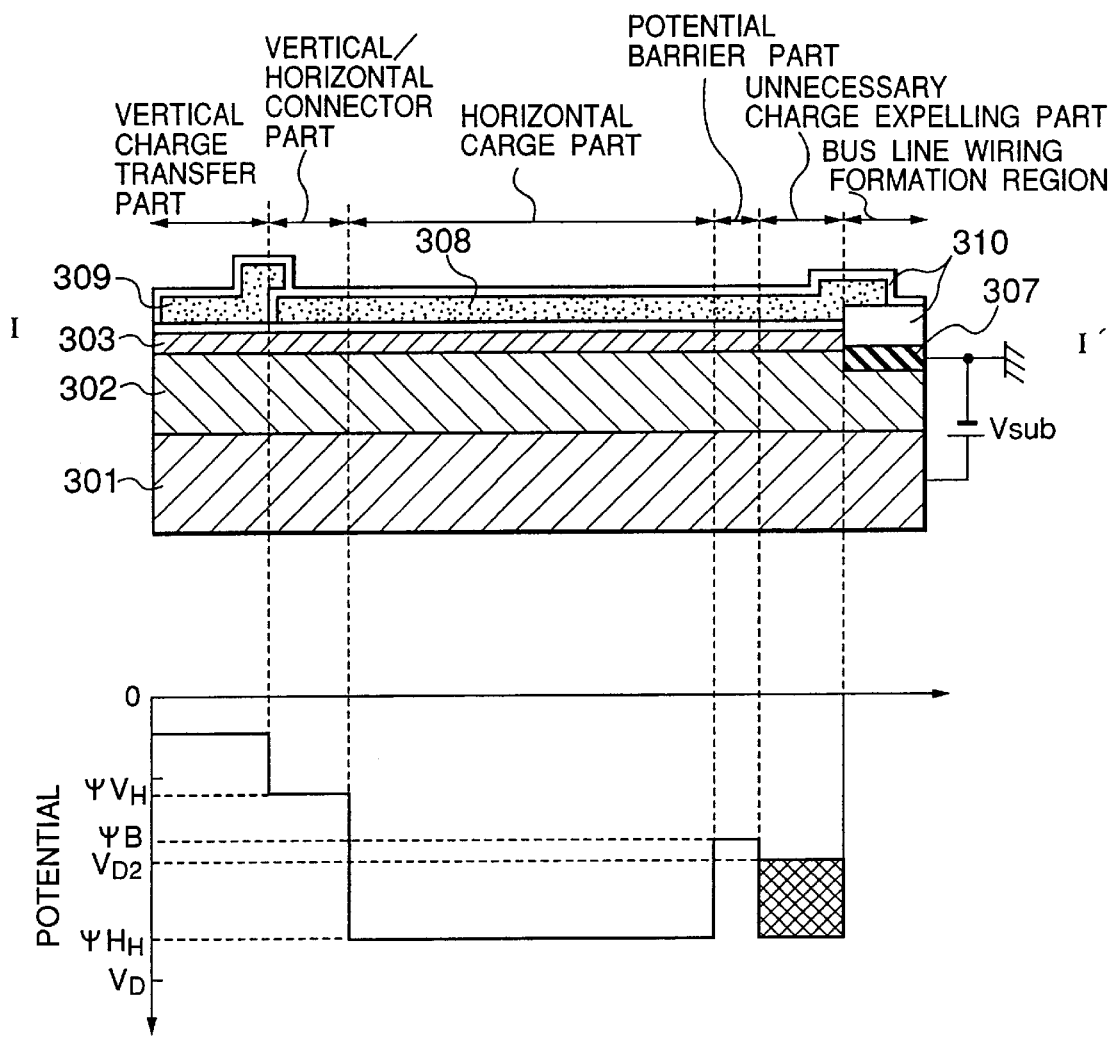
FIG. 10 schematically shows an arrangement of a solid state imaging device having a charge expelling part adjacent to a horizontal charge transfer part in accordance with a second embodiment of the present invention.
Figure 11:
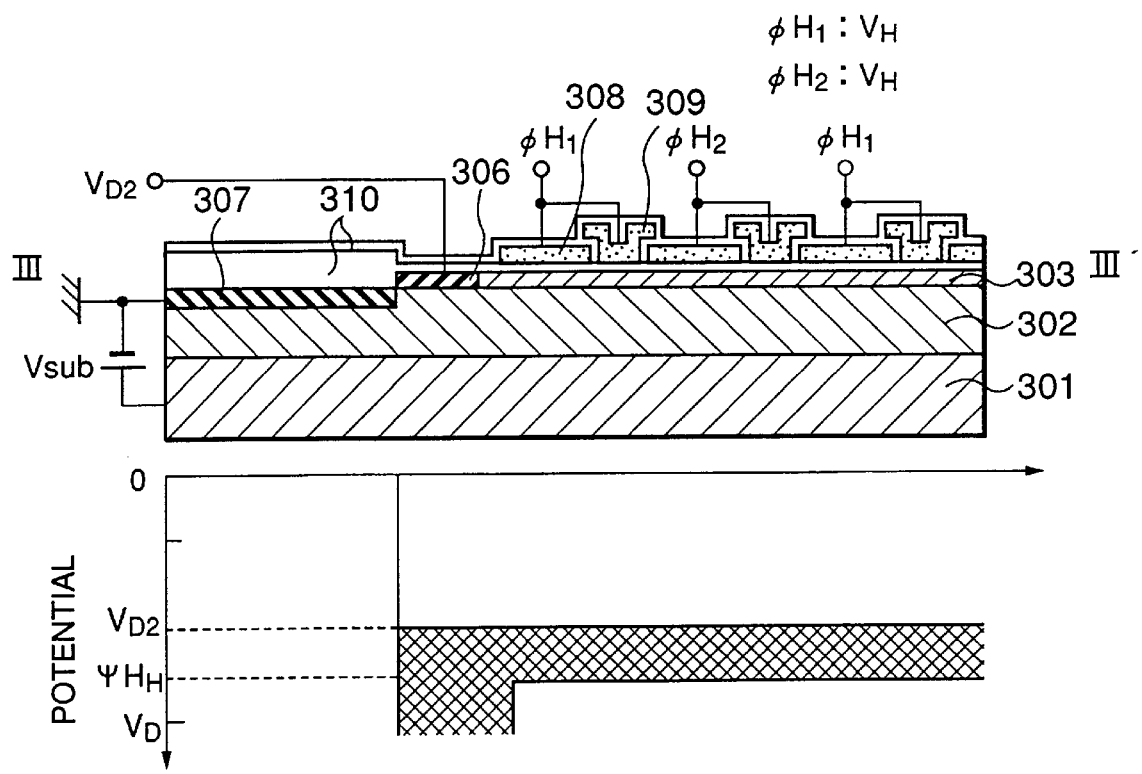
FIG. 11 shows a cross-sectional view of the solid state imaging device of a second embodiment taken along a plane I–I' and a diagram showing its potential.
Figure 12:
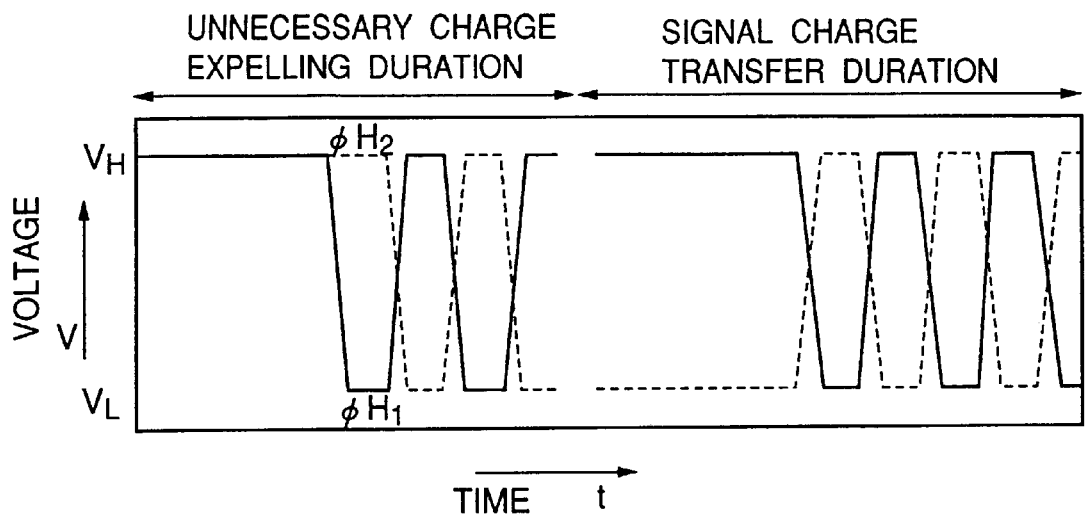
FIG. 12 shows a cross-sectional view of the solid state imaging device of the second embodiment taken along a plane III–III' and a diagram showing its potential.

Referring to FIG.10 and FIG.11, it is different from the first embodiment of the present invention in that a constant voltage $V_{D2}$ is applied to the $N^+$ type semiconductor region 303 of the unnecessary charge expelling part through the $N^{++}$ type regions 106 and 306 and provided at one end of the unnecessary charge expelling part. The constant voltage VD2 is shallower than a potential $\Phi H_H$ induced in the N type semiconductor region 303 under the first horizontal charge transfer electrode 205 and is deeper than a potential $\Phi B$ at the potential barrier part when the horizontal charge transfer signal φH1 and φH2 supplied to the horizontal charge transfer electrode are high level. In this connection, a difference between the constant voltage $V_{D2}$ and the potential $\Phi H$ and between the constant voltage VD2 and the potential $\Phi B$ is desirably 0.5 V or more.

Together with the aforementioned operation, the operation of the second embodiment is the almost same operation of the first embodiment. It is one difference that during the unnecessary charge expelling duration, charge transfer to the horizontal charge transfer part and the unnecessary charge transfer part when the horizontal charge transfer signals φH1,H2 supplied to the horizontal charge transfer electrodes 205,206 is high level.

As has been mentioned in the foregoing, the solid state imaging device of the second embodiment of the present invention also has an advantage that the solid state imaging device of the second embodiment can operate in substantially the same manner as in the solid state imaging device of the first embodiment and further, a constant voltage set margin of the $V_{D2}$ can be made wider than that of the $V_{D1}$ in the first embodiment.

Figure 13:
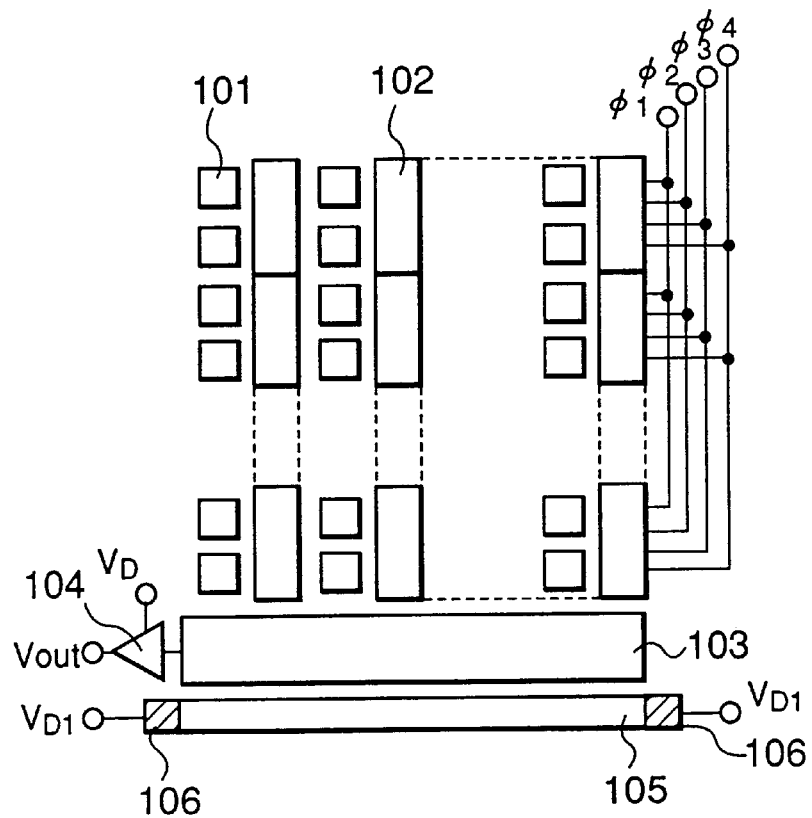
FIG. 13 shows an exemplary clock pulse applied to the horizontal charge transfer part of the solid state imaging device of the second embodiment of the present invention.
Figure 14:
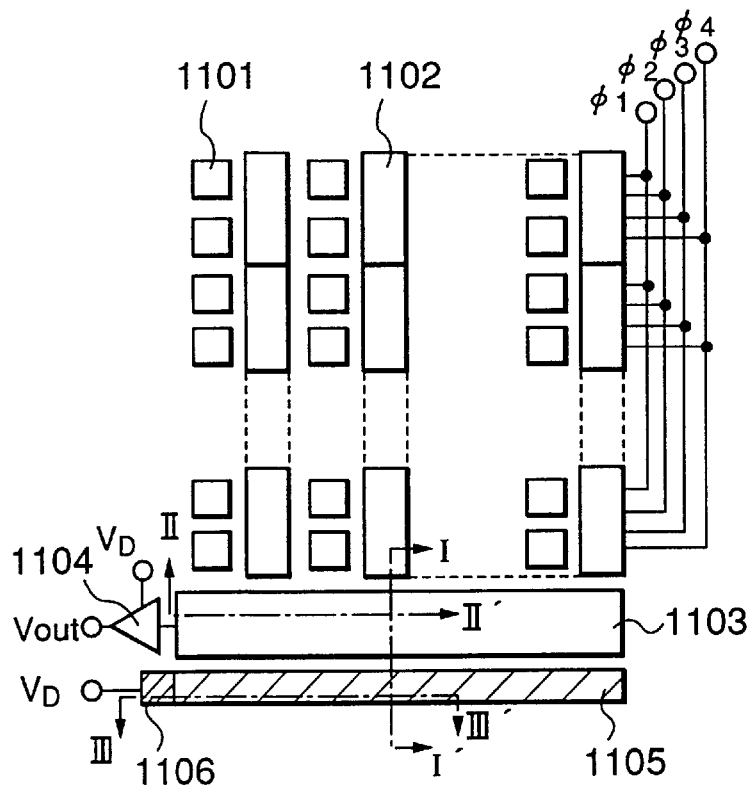
FIG. 14 schematically shows an arrangement of a solid state imaging device having a charge expelling part adjacent to a horizontal charge transfer part in a prior art solid state imaging device.
Figure 15:
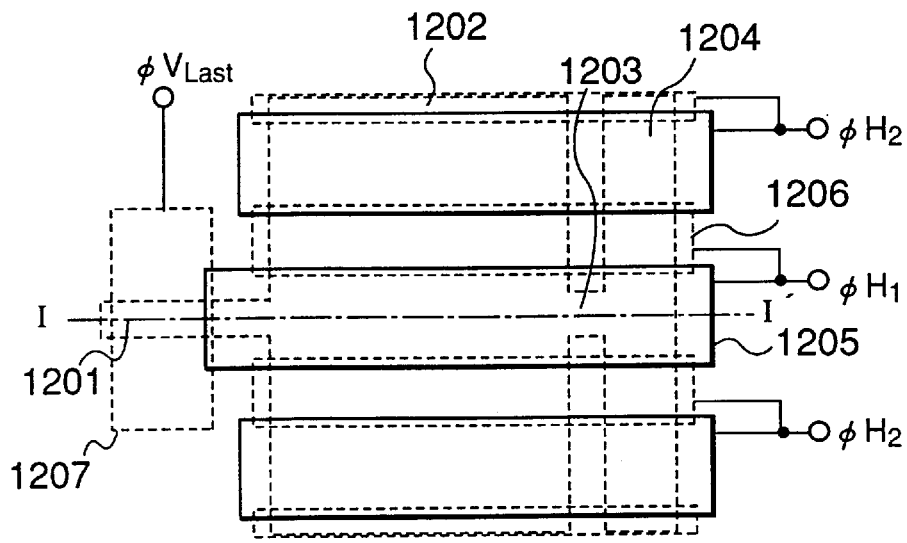
FIG. 15 is a plane view of a zone having a charge expelling part adjacent to the horizontal charge transfer part in the prior art.
Figure 16:
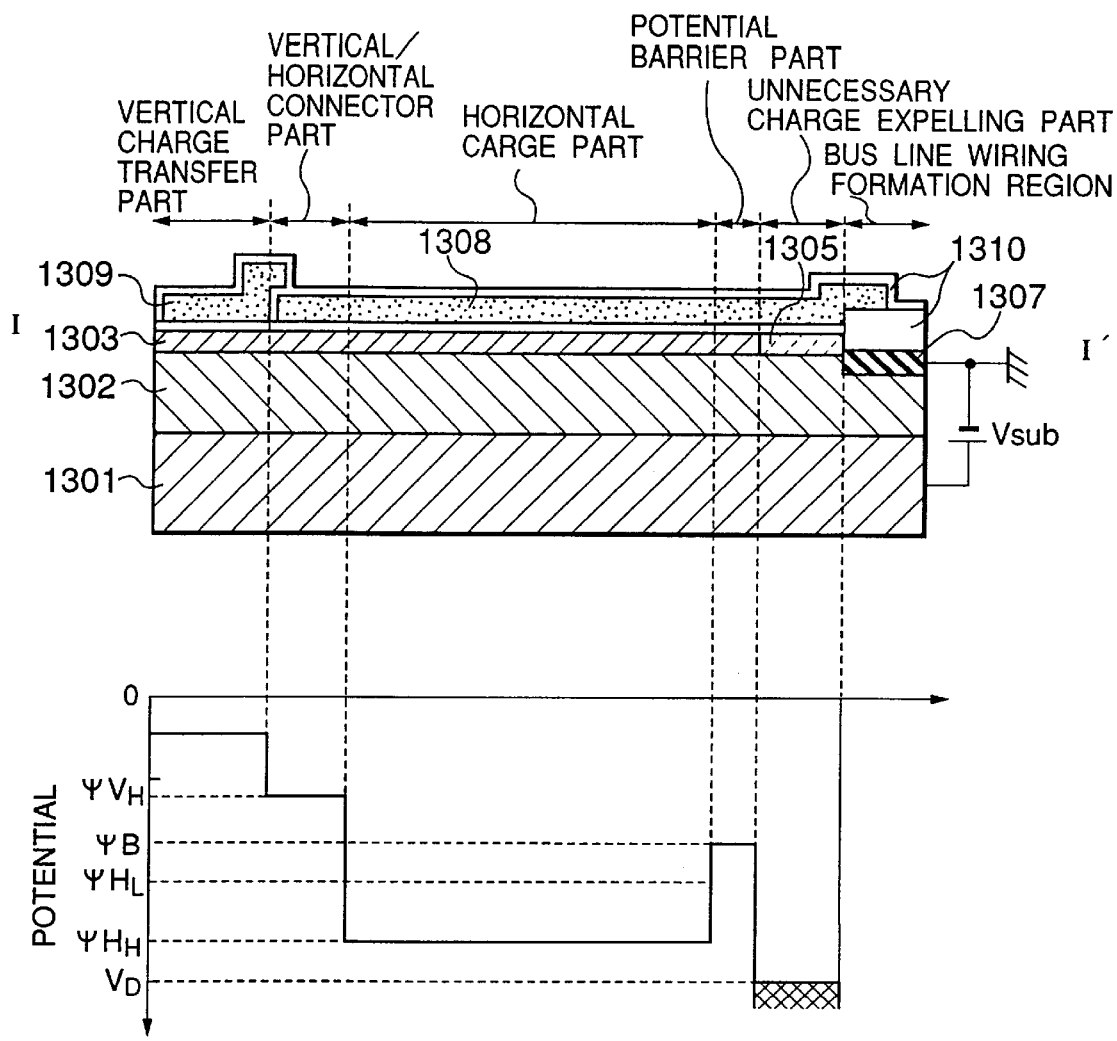
FIG. 16 shows a cross-sectional view of the prior art solid state imaging device taken along a plane I–I' and a diagram showing its potential.
Figure 17:
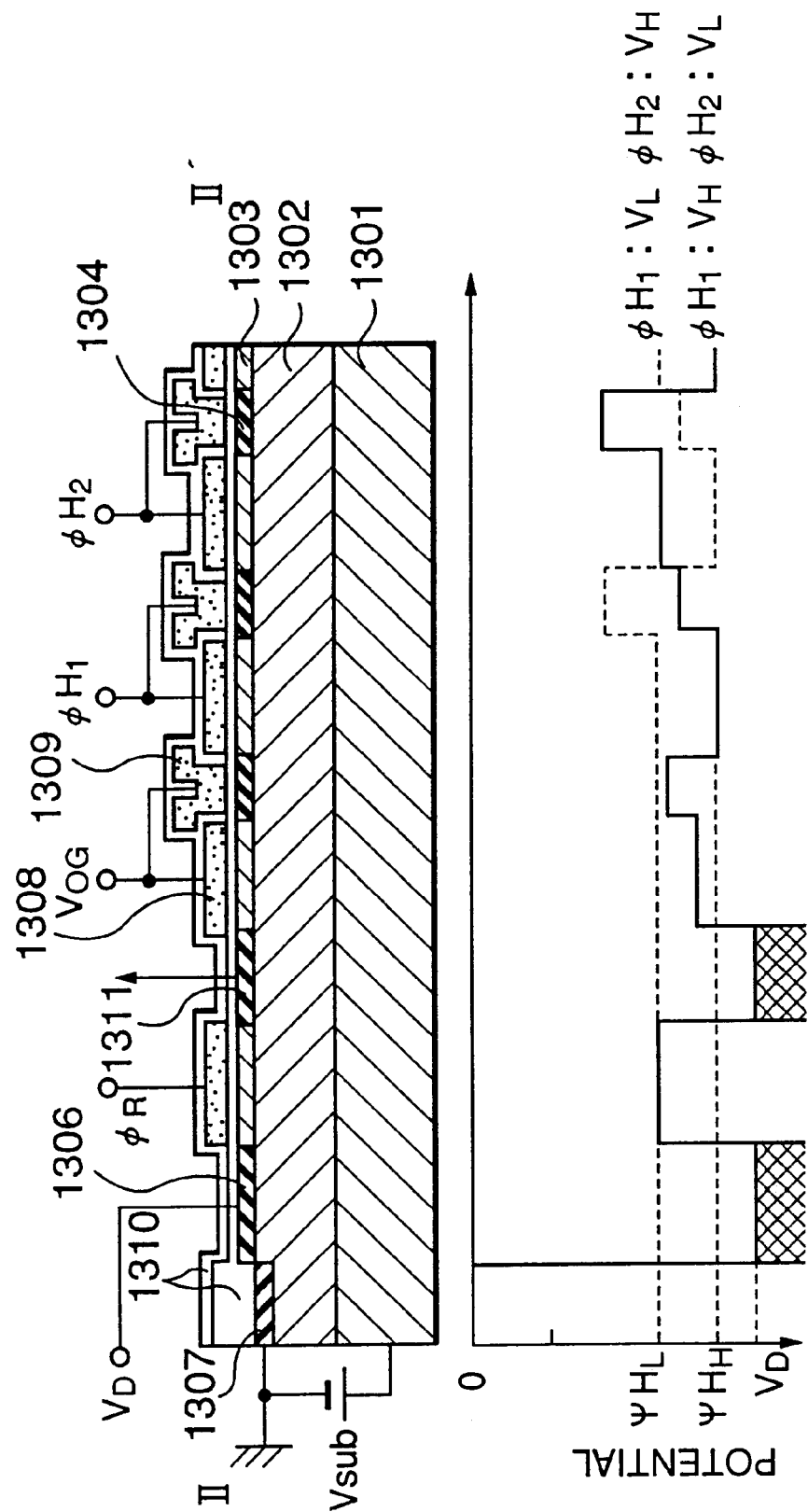
FIG. 17 shows a cross-sectional view of the prior art solid state imaging device taken along a plane II–II' and a diagram showing its potential.
Figure 18:
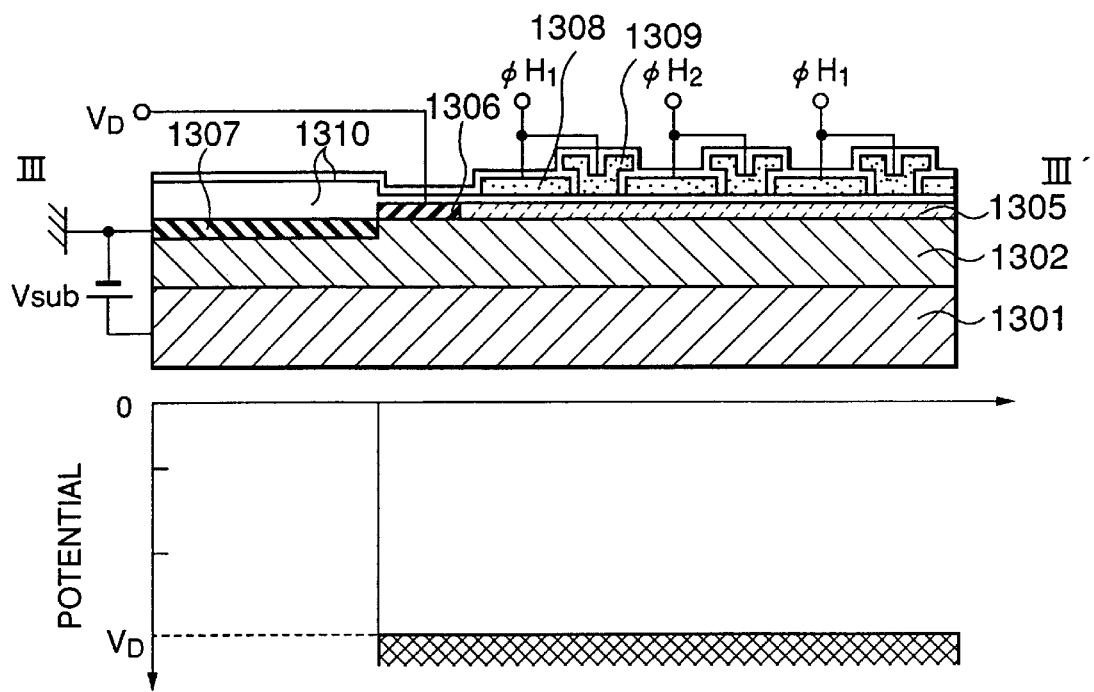
FIG. 18 shows a cross-sectional view of the prior art solid state imaging device taken along a plane III–III' and a diagram showing its potential.
Figure 19:
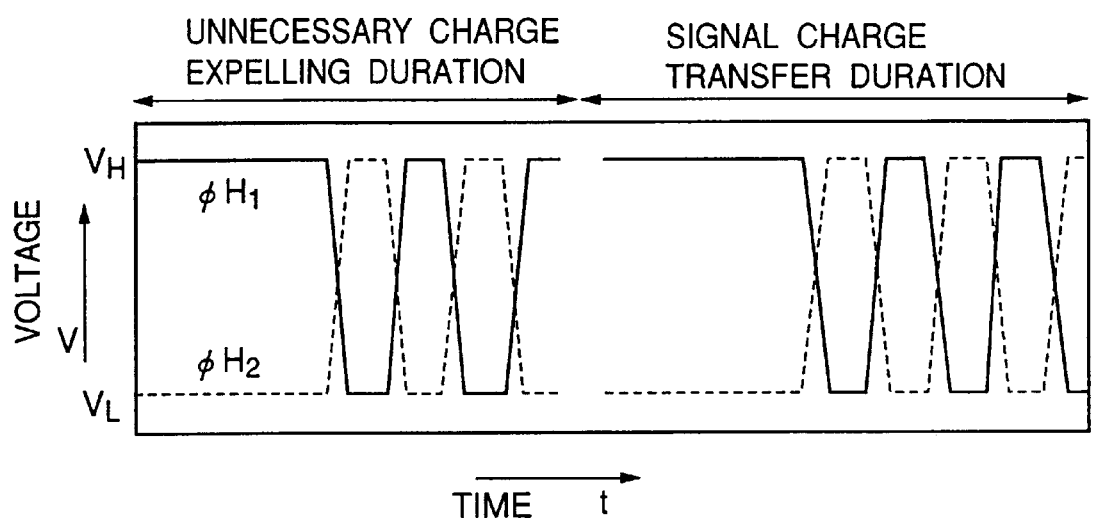
FIG. 19 shows an exemplary clock pulse applied to the horizontal charge transfer part in the prior art solid state imaging device.

Referring to FIG. 13, $N^{++}$ semiconductor region 106 is provide both side of the unnecessary charge expelling part 105. Therefore, the solid state imaging device of the third embodiment of the present invention has an advantage that the ability to remove the unnecessary charge improve since the distance between the unnecessary charge expelling part 105 and $N^{++}$ semiconductor region 106 is shorter than the solid state imaging device of the first and second embodiment of the present invention.

It is apparent that the present invention is not limited to the above embodiments but may be modified and changed without departing from the scope and spirit of the present invention.

Although the explanation has been made in connection with the charge transfer device in which the potential barrier region is formed by the narrow channel effect of the charge transfer channel in the foregoing embodiments of the present invention, it goes without saying that, even when the present invention can be similarly applied to a charge transfer device wherein the potential barrier region is formed by introducing impurities of an electric conduction type opposite to the N type semiconductor region forming the embedded channel, or can be applied to a charge transfer device wherein the potential barrier region is formed by arranging exclusive electrodes and applying a desired potential to the electrodes.

In the foregoing embodiments of the present invention, the $N^{++}$ type diffusion layer applied with the constant voltage $V_{D1}$ or $V_{D2}$ has been arranged only at one end of the unnecessary charge expelling part. However, the present invention may be similarly applied even to such a solid state imaging device that the $N^{++}$ type diffusion layer is arranged at both ends of the unnecessary charge expelling part, as a matter of course.

Further, though explanation has been made in connection with the example wherein the invention is applied to the charge transfer device of the embedded and 2-phase drive type in the foregoing embodiments, it goes without saying that the invention can be similarly applied even to a surface type charge transfer device or even to a charge transfer device of 3-phase or 4-phase drive type.

As has been explained in the foregoing, in accordance with the present invention, since, with respect to the semiconductor regions formed having the same impurity concentration profile, the N type semiconductor region used as the unnecessary charge expelling region is used in the non-depleted state while the N type semiconductor region used as the charge transfer channel of the horizontal charge transfer part is used in the depleted state; the solid state imaging device of the present invention can operation in substantially the same manner as the prior art solid state imaging device and the N type semiconductor region of the unnecessary charge expelling region can be formed to have the same impurity concentration profile as the N type semiconductor region of the charge transfer channel of the horizontal charge transfer part. Therefore, there can be advantageously provided a solid state imaging device which comprises the unnecessary charge expelling region to avoid an increase in the number of manufacturing steps, when compared to the solid state imaging device not having the unnecessary charge expelling part.

In addition, the solid state imaging device of the present invention is advantageous in that it is unnecessary to form the $N^+$ type semiconductor region of the unnecessary charge expelling part having a relatively high impurity concentration under the horizontal charge transfer electrode, so that, upon forming the gate insulating film under the horizontal charge transfer electrode in the later step, such a defect in the prior art solid state imaging device can be eliminated that the outward diffusion of impurities from the $N^+$ type semiconductor region causes formation of an abnormal diffusion layer in the N type semiconductor region of the channel region or in the potential barrier region, thus involving fluctuations in the potential.

While the present invention has been described in connection with certain preferred embodiments, it is to be understood that the subject matter encompassed by the present invention is not limited to those specific embodiments. On the contrary, it is intended to include all alternatives, modifications, and equivalents as can be included within the spirit and scope of the following claims.

What is claimed is:

1. A solid state imaging device comprising;
    a photoelectric convert part,
    a vertical charge transfer part arranged adjacent to said photoelectric converter part, a horizontal charge transfer part arranged adjacent to one ends of said vertical charge transfer part and receiving charge transferred from said vertical charge transfer part, and an unnecessary charge expelling region receiving charge overflowed said horizontal charge transfer part, wherein a channel region of said horizontal charge transfer part and said unnecessary charge expelling region have an identical impurity profile, said channel region of said horizontal charge transfer part is applied to a first voltage to be depleted, and said unnecessary charge expelling region is applied to a second voltage to be in non-depleted state.

2. The solid state imaging device as claimed in claim 1, wherein said second voltage is applied to said unnecessary charge expelling region via a diffusion layer provided at one end of said unnecessary charge expelling region.

3. The solid state imaging device as claimed in claim 1, wherein said first voltage is applied to said channel region of said horizontal charge transfer part via a diffusion layer provided at one end of said channel region of said horizontal charge transfer part.

4. The solid state imaging device as claimed in claim 1, wherein a high level voltage is applied to all said horizontal charge transfer electrodes at the same time.

5. The solid state imaging device as claimed in claim 1, wherein a potential applied to said unnecessary charge expelling part is shallower by 0.5 V or more than the potential at the time of the deleted state of said unnecessary charge expelling part.

6. The solid state imaging device as claimed in claim 4, wherein the potential applied to said unnecessary charge expelling part is shallower by 0.5 V or more than the potential at the time of the deleted state of said unnecessary charge expelling part.

\* \* \* \* \*